(12) United States Patent
Sato et al.

(10) Patent No.: US 8,299,859 B2
(45) Date of Patent: Oct. 30, 2012

(54) SURFACE MOUNT CRYSTAL OSCILLATOR AND MANUFACTURING METHOD OF THE SAME

(75) Inventors: Masashi Sato, Sayama (JP); Yoshinori Ikeda, Sayama (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 0 days.

(21) Appl. No.: 12/926,788

(22) Filed: Dec. 9, 2010

(65) Prior Publication Data

US 2011/0133844 A1  Jun. 9, 2011

(30) Foreign Application Priority Data

Dec. 9, 2009  (JP) .............. P.2009-279019
Sep. 29, 2010  (JP) .............. P.2010-219149

(51) Int. Cl.
 *H03B 1/00* (2006.01)

(52) U.S. Cl. ..................... 331/68; 331/158

(58) Field of Classification Search .......... 331/68, 331/158; 310/348
See application file for complete search history.

(56) References Cited

U.S. PATENT DOCUMENTS

| 7,095,161 | B2 * | 8/2006 | Unno et al. | 310/348 |
| 7,256,658 | B2 * | 8/2007 | Asamura | 331/68 |
| 7,482,735 | B2 * | 1/2009 | Harada et al. | 310/348 |
| 2002/0033652 | A1 * | 3/2002 | Serizawa | 310/348 |

FOREIGN PATENT DOCUMENTS

| JP | 08-111627 | 4/1996 |
| JP | 08-162891 | 6/1996 |
| JP | 2001-024469 | 1/2001 |
| JP | 2001-110925 | 4/2001 |
| JP | 2003-179456 | 6/2003 |
| JP | 2007-158419 | 6/2007 |
| JP | 2008-035410 | 2/2008 |
| WO | 2005/109638 | 11/2005 |
| WO | 2009/072351 | 6/2009 |

* cited by examiner

*Primary Examiner* — Joseph Chang
(74) *Attorney, Agent, or Firm* — Jacobson Holman PLLC

(57) ABSTRACT

There are disclosed a surface mount crystal oscillator which can enhance a product quality and improve productivity while realizing miniaturization and a manufacturing method of the crystal oscillator. On wall faces of through holes formed in corner portions of a rectangular ceramic base, through terminals are formed; on the front surface of the ceramic base, leading terminals of crystal holding terminals which hold a crystal piece are connected to the diagonal through terminals; on the back surface of the ceramic base, mount terminals connected to the through terminals are formed; and the opening end face of a metal cover joined onto the ceramic base via the molten resin comprises a flange having an inclined face in the surface mount crystal oscillator.

9 Claims, 7 Drawing Sheets

SURFACE MOUNT CRYSTAL OSCILLATOR AND MANUFACTURING METHOD OF THE SAME

This application has a priority of Japanese no. 2009-279019 filed Dec. 9, 2009, and no. 2010-219149 filed Sep. 29, 2010 hereby incorporated by reference.

BACKGROUND OF THE INVENTION

1. Field of the Invention

The present invention relates to a crystal oscillator for surface mount, and more particularly, it relates to a surface mount crystal oscillator which can improve productivity and realize miniaturization and a manufacturing method of the same.

2. Description of the Related Art

[Prior Art]

A surface mount crystal oscillator is small-sized and light-weight, and is hence incorporated as a frequency or time reference source in a portable type electronic device.

In a conventional surface mount crystal oscillator, a crystal piece 2 is mounted on a ceramic substrate, and is covered and sealed with an inverted cover having a recessed shape. In recent years, there has been suggested an inexpensive household oscillator having a frequency deviation $\Delta f/f$ which is comparatively loosely regulated, for example, from ±150 to ±250 ppm.

[Related Art]

It is to be noted that examples of a related art include Japanese Patent Application Laid-Open No. 2007-158419 'Surface Mount Crystal Oscillator' (Nihon Dempa Kogyo Co., Ltd.) [Patent Document 1], Japanese Patent Application Laid-Open No. 2003-179456 'Surface Mount Container for Crystal Product and Crystal Product using the Same' (Nihon Dempa Kogyo Co., Ltd.) [Patent Document 2], and Japanese Patent Application Laid-Open No. 2001-110925 'Conductive Cap, Electronic Component, and Method of forming Insulating Film on Conductive Cap' (Murata Mfg. Co., Ltd.) [Patent Document 3].

Patent Document 1 discloses a constitution of a surface mount crystal oscillator in which a crystal piece 3 is mounted on an IC chip 2, the IC chip 2 and the like are formed on a mount substrate 4, and a metal cover 5 is disposed.

Moreover, Patent Document 2 discloses a constitution of a surface mount container for a crystal product in which a crystal piece 3 is disposed on a single layer substrate 1A via a crystal terminal 6, and is sealed with a cover 2.

Furthermore, Patent Document 3 discloses a constitution in which a contact face between a substrate 2 and a metal cap 3 to cover a piezoelectric element 4 formed on the substrate 2 has a curved inner side face.

SUMMARY OF THE INVENTION

However, in the above conventional surface mount crystal oscillator, in recent years, an increasingly miniaturized constitution obtained by mounting a crystal piece on a substrate and further sealing the piece with a cover has a problem that it is difficult to decrease a defect ratio, improve productivity and enhance a product quality.

Specifically, when the crystal piece and the cover are miniaturized, the constitution needs to be contrived so that crystal holding terminals connected to the crystal piece by a conductive adhesive to hold the crystal oscillator and leading terminals led from the crystal holding terminals to electrodes do not electrically cause short circuit, and the conventional constitution cannot sufficiently realize miniaturization.

Moreover, in Patent Document 3, a metal cap which comes in contact with a substrate is disclosed, but the metal cap is not applied in consideration of miniaturization in a relation between the cap itself and the leading terminals.

The present invention has been developed in view of the above situation, and an object thereof is to provide a surface mount crystal oscillator which can enhance a product quality and improve productivity while realizing miniaturization and a manufacturing method of the same.

To solve the problems of the above conventional examples, the present invention provides a surface mount crystal oscillator comprising a crystal piece held by first and second crystal holding terminals on a rectangular ceramic substrate, and sealed with a metal cover via a seal material of a molten resin, wherein on wall faces of through holes formed in corner portions of the substrate, through terminals are formed, on the front surface of the substrate, a first leading terminal led from the first crystal holding terminal is connected to the through terminal of the shortest corner portion, and a second leading terminal led from the second crystal holding terminal is connected to the through terminal of the corner portion in a direction reverse to a direction in which the first leading terminal is led, on the back surface of the substrate, mount terminals connected to the through terminals are formed, and the opening end face of the metal cover joined onto the ceramic substrate via the molten resin comprises a flange having an inclined face, which produces an effect that while realizing miniaturization, short circuit can be prevented to enhance a product quality, thereby improving productivity.

Moreover, according to the present invention, in the above surface mount crystal oscillator, one leading electrode and the other leading electrode of the crystal piece are led in opposite directions, and the first crystal holding terminal and the second crystal holding terminal constitute such a both-ends holding type as to hold both ends of the crystal piece.

Furthermore, according to the present invention, in the above surface mount crystal oscillator, the first crystal holding terminal is connected to the one leading electrode of the crystal piece by a conductive adhesive in an end portion from which the first leading terminal is led, and the second crystal holding terminal is connected to the other leading electrode of the crystal piece by the conductive adhesive in an end portion from which the second leading terminal is led.

In addition, according to the present invention, in the above surface mount crystal oscillator, the end portion of the first crystal holding terminal on a side on which any conductive adhesive is not disposed is formed to be short inwardly from the end portion of the one leading electrode, and the end portion of the second crystal holding terminal on a side on which any conductive adhesive is not disposed is formed to be short inwardly from the end portion of the other leading electrode.

Moreover, according to the present invention, in the above surface mount crystal oscillator, the one leading electrode and the other leading electrode of the crystal piece are led in the same direction, and the first crystal holding terminal and the second crystal holding terminal constitute such a cantilever type as to hold one end of the crystal piece.

Furthermore, according to the present invention, in the above surface mount crystal oscillator, the first crystal holding terminal is connected to the one leading electrode led to one side of the crystal piece by a conductive adhesive in an end portion from which the first leading terminal is led, the second crystal holding terminal is connected to the other leading electrode led to the one side of the crystal piece by the conductive adhesive in the one side of the crystal piece from which the other leading electrode is led, and the second leading terminal passes under the crystal piece from a position of the second crystal holding terminal connected by the conductive adhesive and is connected to the through terminal of the corner portion in the direction reverse to the direction in which the first leading terminal is led.

Moreover, according to the present invention, in the above surface mount crystal oscillator, the flange of the opening end face of the metal cover has the inclined face descending from the inside to the outside or the inclined face ascending from the inside to the outside.

The present invention provides a manufacturing method of a surface mount crystal oscillator comprising a crystal piece held by first and second crystal holding terminals on a rectangular ceramic substrate, and sealed with a metal cover via a seal material of a molten resin, comprising: a step of forming, in a sheet-like ceramic material, break lines which specify individual ceramic substrate regions and through holes which correspond to corner portions of the regions and firing the ceramic material to form a sheet-like ceramic base; a step of forming metal layers of through terminals on wall faces of the through holes, forming, on the front surface of the ceramic base, a pattern of a metal layer in which the first crystal holding terminal and a first leading terminal led from the terminal are connected to the through terminal of the shortest corner portion, and a second leading terminal led from the second crystal holding terminal is connected to the through terminal of the corner portion in a direction reverse to a direction in which the first leading terminal is led, and forming, on the back surface of the ceramic base, a pattern of a metal layer of mount terminals connected to the through terminals; a step of mounting the crystal piece on the first and second crystal holding terminals; a step of regulating a vibration frequency by use of the mount terminal connected to the first crystal holding terminal and the mount terminal connected to the second crystal holding terminal; and a step of immersing, into a molten resin solution, a flange having an inclined face as the opening end face of the metal cover joined onto the ceramic substrate via the molten resin to form a reservoir portion of the molten resin on the lower surface of the flange, and securing the flange onto the ceramic substrate in a state in which the reservoir portion is formed.

Moreover, according to the present invention, in the above manufacturing method of the surface mount crystal oscillator, an excitation electrode on the front surface of the crystal piece is irradiated with gas ions to cut the front surface from the excitation electrode, and a mass of the excitation electrode is decreased to regulate the vibration frequency from a low frequency to a high frequency.

Furthermore, according to the present invention, in the above manufacturing method of the surface mount crystal oscillator, a metal film is applied onto the excitation electrode to regulate the vibration frequency from a high frequency to a low frequency.

DESCRIPTION OF REFERENCE NUMERALS

1 . . . ceramic base (substrate), 1A . . . sheet-like ceramic base, 2 . . . crystal piece, 3 . . . metal cover (cover), 3a . . . flange, 4 . . . crystal holding terminal, 4a and 4b . . . leading terminal, 5a and 5b . . . mount terminal, 5x . . . through terminal, 6a . . . excitation electrode, 6b leading electrode, 7 . . . conductive adhesive, 8 . . . seal material (molten resin), 8A . . . molten resin solution, and 9 . . . through hole.

DESCRIPTION OF PREFERRED EMBODIMENT

An embodiment of the present invention will be described with reference to the drawings.

[Summary of Embodiment]

In a surface mount crystal oscillator according to an embodiment of the present invention, on wall faces of through holes formed in corner portions of a rectangular ceramic substrate, through terminals are formed. On the front surface of the substrate, leading terminals of crystal holding terminals which hold a crystal piece are connected to the diagonal through terminals. Moreover, on the back surface of the substrate, mount terminals connected to the through terminals are formed. Furthermore, a contact face between a metal cover which covers the crystal piece and the substrate is improved. While realizing miniaturization, short circuit is prevented to enhance a product quality, thereby improving productivity.

Figure 1:
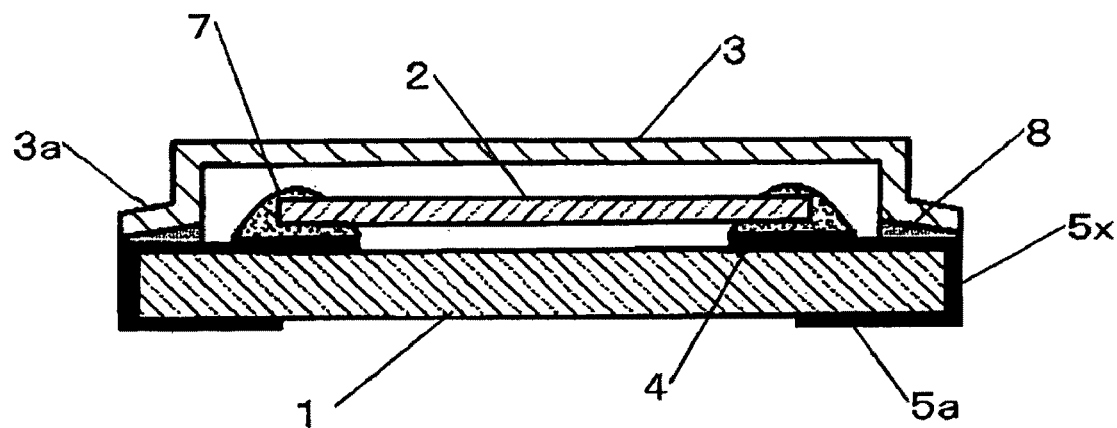
FIG. 1 is an explanatory sectional view of a surface mount crystal oscillator according to an embodiment of the present invention.

[Constitution of Surface Mount Crystal Oscillator: FIG. 1]

The surface mount crystal oscillator according to the embodiment of the present invention will be described with reference to FIG. 1. FIG. 1 is an explanatory sectional view of the surface mount crystal oscillator according to the embodiment of the present invention.

In the surface mount crystal oscillator according to the embodiment of the present invention (the present oscillator), as shown in FIG. 1, a crystal piece 2 is mounted on crystal holding terminals 4 formed on a ceramic base (a substrate) 1 via a conductive adhesive 7. Furthermore, a recessed metal cover (a cover) 3 is inverted and joined onto the ceramic base 1 which is sealed.

Moreover, a through terminal (a side wall terminal) 5x is formed on the side surface of the substrate 1, connected to a leading terminal 4a led from the crystal holding terminal 4 formed on the front surface of the substrate 1, and connected to a mount terminal 5a formed on the back surface of the substrate 1.

The through terminals 5x are formed on side walls of through holes 9 formed in four corners of the substrate 1.

Furthermore, a seal material 8 having insulation properties is formed in a contact portion between the substrate 1 and the cover 3.

In particular, the contact portion of the cover 3 is not formed in an 'L'-shaped type, but has such a shape to open from the inside to the outside in an oblique direction.

In this case, the seal material 8 can easily be formed between the cover 3 and the substrate 1, and the cover 3 is easily disposed. Moreover, a material applying amount is set to be uniform to keep seal properties, and a surplus of the seal material 8 is prevented from being deposited on the contained crystal piece 2.

A specific method will be described later.

Figure 2:
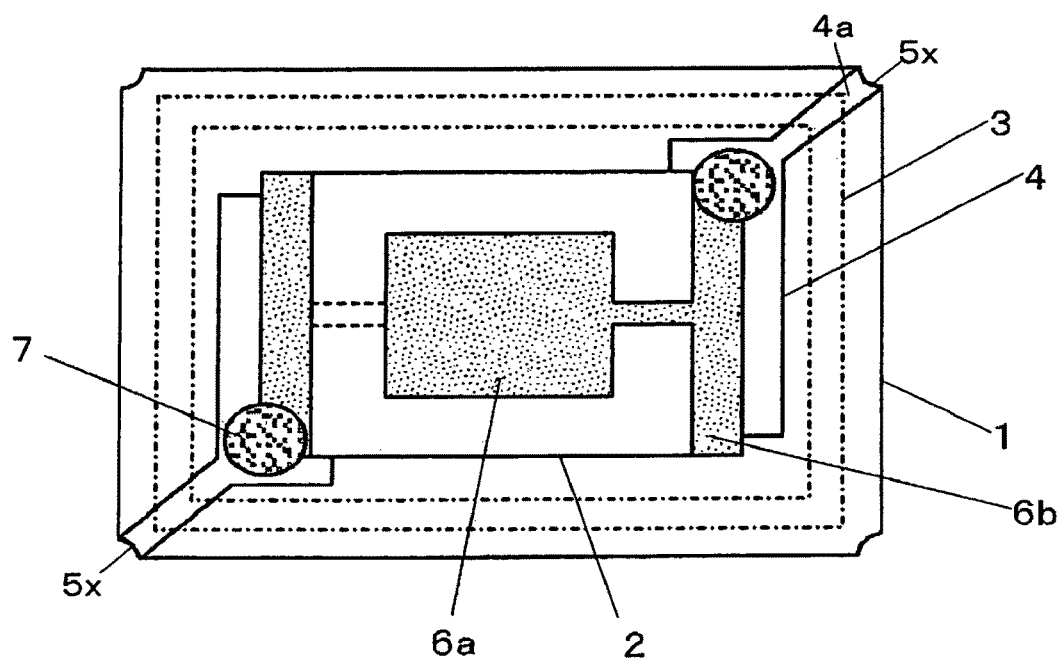
FIG. 2 is an explanatory plan view of the surface mount crystal oscillator according to the embodiment of the present invention.

[Planar Characteristics of Surface Mount Crystal Oscillator: FIG. 2]

Next, planar characteristics of the present oscillator will be described with reference to FIG. 2. FIG. 2 is an explanatory plan view of the surface mount crystal oscillator according to the embodiment of the present invention.

In the present oscillator, as shown in FIG. 2, the crystal holding terminals 4 for holding both ends of the crystal piece 2 are formed so as to face each other on the ceramic base (the substrate) 1, and each leading terminal 4a is formed so as to be led to the shortest corner portion of the substrate 1 from the end portion of the crystal holding terminal 4, and is connected to the through terminal 5x. That is, two leading terminals 4a are connected to the through terminals 5x of the corner portions in reverse directions.

In a case where the leading terminals 4a are led to the corner portions of the substrate 1 and connected to the through terminals 5x in the corner portions, a sufficient distance can be obtained as compared with a case where the leading terminals are led outwardly in a horizontal direction or a vertical direction of the substrate 1, which avoids the short circuit between the crystal holding terminals 4 and the through terminals 5x via the metal cover 3, even if the metal cover 3 is displaced.

Moreover, the crystal piece 2 is connected to the crystal holding terminals 4 via the conductive adhesive 7 in the end portions of the crystal holding terminals 4 from which the leading terminals 4a are led.

As shown in FIG. 2, such a structure as to hold the crystal piece 2 by the crystal holding terminals 4 in both the end portions of the crystal piece 2 is referred to as a 'both-ends holding' type.

A characteristic pattern of the crystal holding terminals 4 will be described later.

[Each Part of Surface Mount Crystal Oscillator]

The ceramic base (the substrate) 1 has a shape of a flat plate comprising a rectangular single plate, the crystal holding terminals 4 are formed at both ends of one main surface (the front surface) of the base, and mount terminals 5a and 5b are formed in four corner portions of the other main surface (the back surface) thereof.

Moreover, the mount terminals 5a and 5b formed in the four corner portions of the back surface thereof are connected to the through terminals 5x formed on the wall faces of the through holes 9.

Here, the mount terminal 5a is connected to the leading terminal 4a via the through terminal 5x, whereas the mount terminal 5b is connected to the through terminal 5x but is not connected to the leading terminal 4a.

The crystal piece 2 is AT cut, and excitation electrodes 6a facing each other are formed on both main surfaces of the crystal piece.

Moreover, the crystal piece 2 is provided with leading electrodes 6b extending from the excitation electrodes 6a to both end portions in mutually opposite directions to be folded back over the whole width in a width direction.

Furthermore, one set of extending diagonal portions (end portions) of the leading electrode 6b are secured to the crystal holding terminal 4 by the conductive adhesive 7, to electrically and mechanically connect the leading electrode 6b to the crystal holding terminals 4.

The metal cover 3 has a recessed shape, has an opening end face thereof bent so as to open from the inside to the outside of an L-shape in an oblique direction, and is joined to the substrate 1 along the outer peripheral front surface of the substrate 1 by a resin as the insulating seal material 8. As the resin, a molten resin is used.

Specifically, the opening of the metal cover 3 comprises a flange 3a having a gradient (an inclined face) descending toward an outer dead end. Details will be described with reference to FIGS. 9 and 10.

The crystal holding terminals 4 are configured to hold the crystal piece 2, and are made of a silver (Ag)-palladium (Pd) alloy. Moreover, each leading terminal 4a is formed along the shortest corner portion of the substrate 1 from the end portion of the crystal holding terminal 4.

The through terminals 5x are formed on the side walls of the through holes 9 formed in the four corners of the substrate 1, and are made of an AgPd alloy in the same manner as in the crystal holding terminals 4.

Moreover, the leading terminals 4a are connected to the through terminals 5x in the four corner portions of the substrate 1.

Additionally, since the leading terminals 4a are formed along the diagonal line of the substrate 1, the terminals are connected to the through terminals 5x in the diagonal corner portions thereof, but the through terminals 5x are not connected to the leading terminals 4a in other diagonal corner portions.

The mount terminals 5a and 5b are formed in four corners of the back surface of the substrate 1, and connected to the through terminals 5x in the corner portions of the substrate 1.

As described above, the through terminals 5x include the through terminals connected to the leading terminals 4a and the through terminals which are not connected to the leading terminals, and on the back surface of the substrate 1, the mount terminals 5a connected to the through terminals 5x connected to the leading terminals 4a are brought into contact with each other and energized in a test by a measurement device, thereby regulating a vibration frequency as described later.

The conductive adhesive 7 electrically and mechanically connects the leading electrodes 6b of the crystal piece 2 to the crystal holding terminals 4.

The seal material (the molten resin) 8 is an insulating and joining molten resin disposed to secure the cover 3 onto the substrate 1 so that the contact face of the cover 3 does not come in contact with the leading terminals 4a and the like (does not cause any short circuit).

The through holes 9 are formed simultaneously with break lines in a ceramic sheet before divided into the substrates 1, and the holes are formed in the four corner portions of the divided substrate 1 so as to extend through the front surface and back surface thereof.

Figure 3:
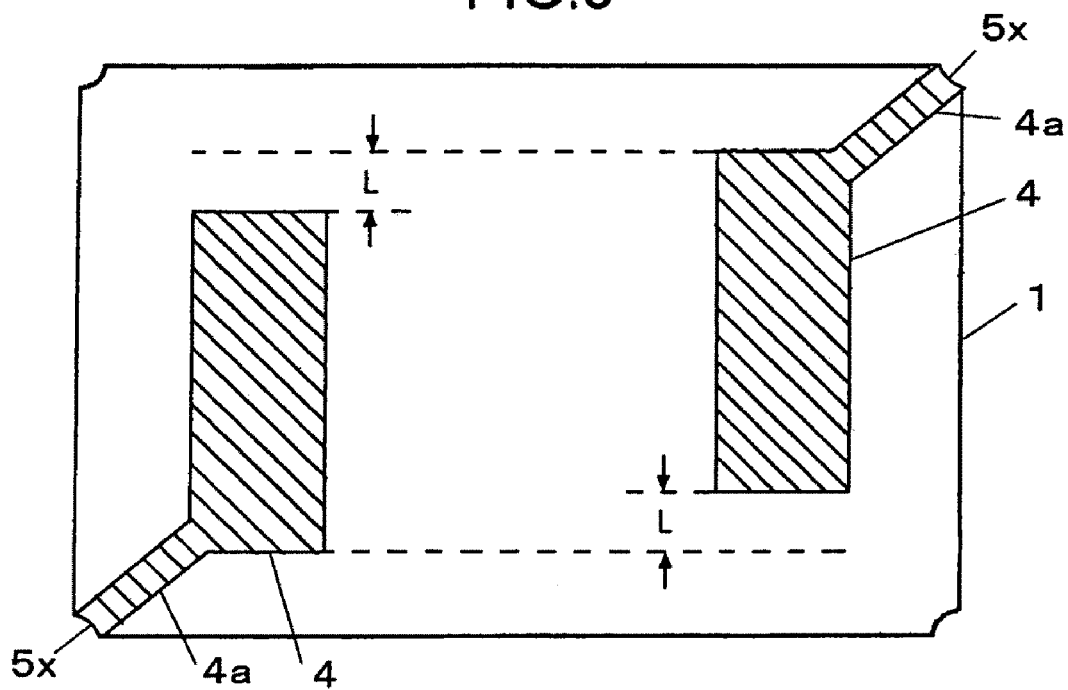
FIG. 3 is a schematic plan view for explaining a pattern of crystal holding terminals.

[Pattern of Crystal Holding Terminal: FIG. 3]

Next, specific patterns of the crystal holding terminals 4 and leading terminals 4a will be described with reference to FIG. 3. FIG. 3 is a schematic plan view for explaining the pattern of the crystal holding terminals.

In the pattern of the crystal holding terminals 4, as shown in FIG. 3, the terminals are formed so as to face each other around the center of the substrate 1, and the end portions of the terminals which are not provided with the leading terminals 4a are shorter than those of conventional crystal holding terminals as much as a length L. In consequence, even when the metal cover 3 comes in contact with one of the crystal holding terminals 4, the cover is prevented from coming in contact with the other crystal holding terminal 4, to avoid the short circuit.

Figure 4:
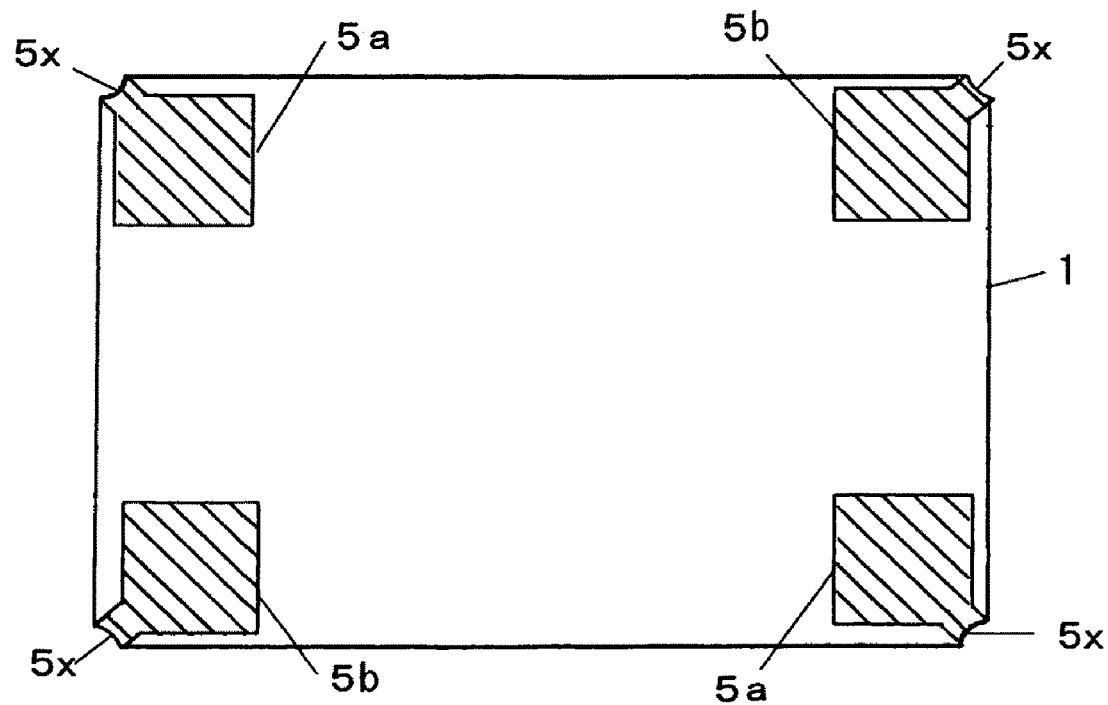
FIG. 4 is a schematic plan view for explaining a pattern of mount terminals.

[Pattern of Mount Terminal 5a on Back Surface of the Present Oscillator: FIG. 4]

Moreover, on the back surface of the substrate 1, the mount terminals 5a and 5b have a pattern shown in FIG. 4, and in the four corners of the substrate 1, rectangular metal terminals are connected to the through terminals 5x formed on the wall faces of the through holes 9.

FIG. 4 is a schematic plan view for explaining the pattern of the mount terminals.

Figure 5:
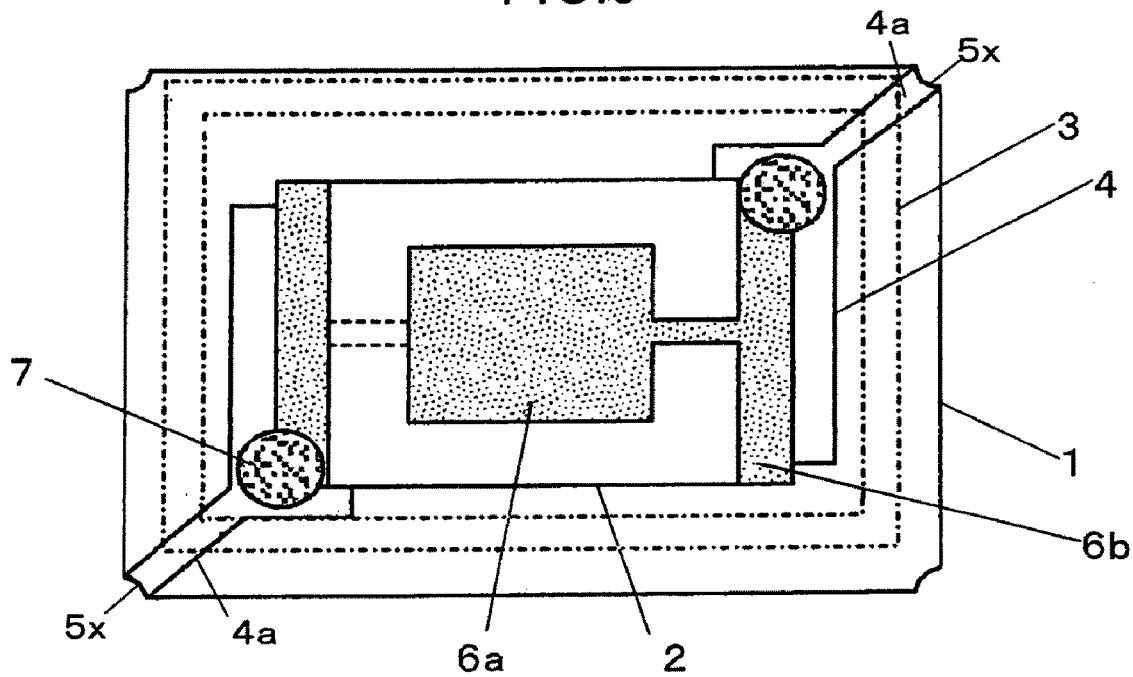
FIG. 5 is an explanatory plan view showing displacement of a metal cover.

[Displacement of Metal Cover: FIG. 5]

Next, displacement of the metal cover 3 in the present oscillator will be described with reference to FIG. 5. FIG. 5 is an explanatory plan view showing the displacement of the metal cover.

A place shown by dotted lines of FIG. 2 indicates a contact face in a case where the metal cover 3 is normally disposed, and a place shown by dotted lines of FIG. 5 indicates the contact face of the metal cover 3 in a case where the displacement occurs.

Even when the displacement of the metal cover 3 occurs, the crystal holding terminal 4 is shorter than the conventional crystal holding terminal as much as the length L, and the end portion of the crystal holding terminal 4 is short inwardly from the end portion of the leading electrode 6b in a longitudinal direction. Therefore, even when the metal cover 3 comes in contact with the other crystal holding terminal 4, the end portion of the crystal holding terminal 4 does not come in contact with the metal cover 3. In consequence, it is possible to avoid the short circuit between the one crystal holding terminal 4 and the other crystal holding terminal 4 via the metal cover 3.

Specifically, in FIG. 5, even when the lower portion of the opening end face of the metal cover 3 comes in contact with the one crystal holding terminal 4 in the horizontal direction, the metal cover 3 does not come in contact with the other crystal holding terminal 4 in the same horizontal direction, so that the short circuit can be avoided.

[Manufacturing Method of the Present Oscillator: FIGS. 6 to 10]

Figure 6:
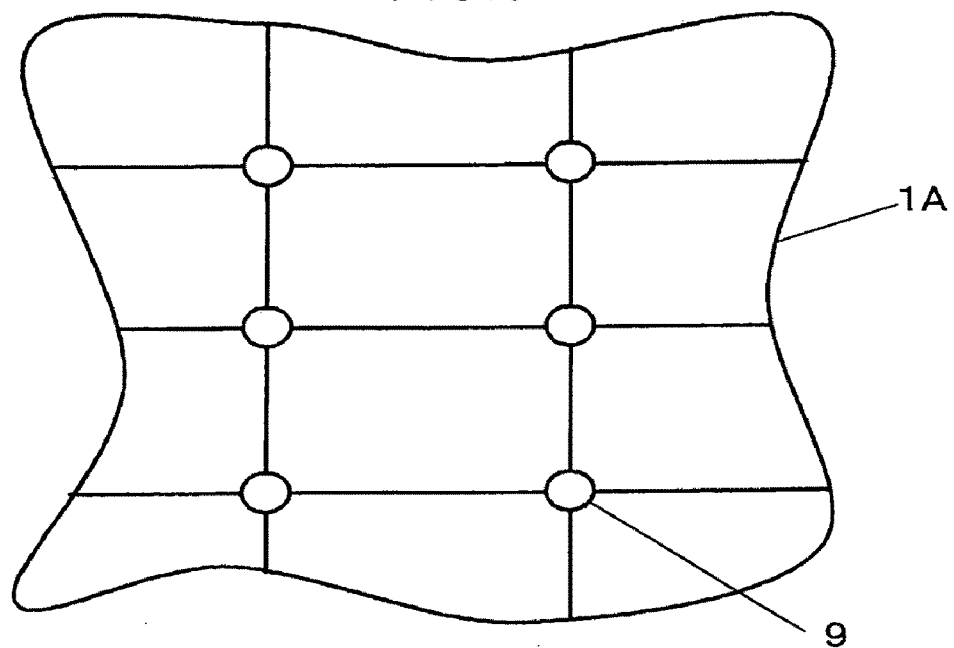
FIG. 6 is a diagram showing that through holes and break lines are formed in a sheet-like ceramic plate.
Figure 7:
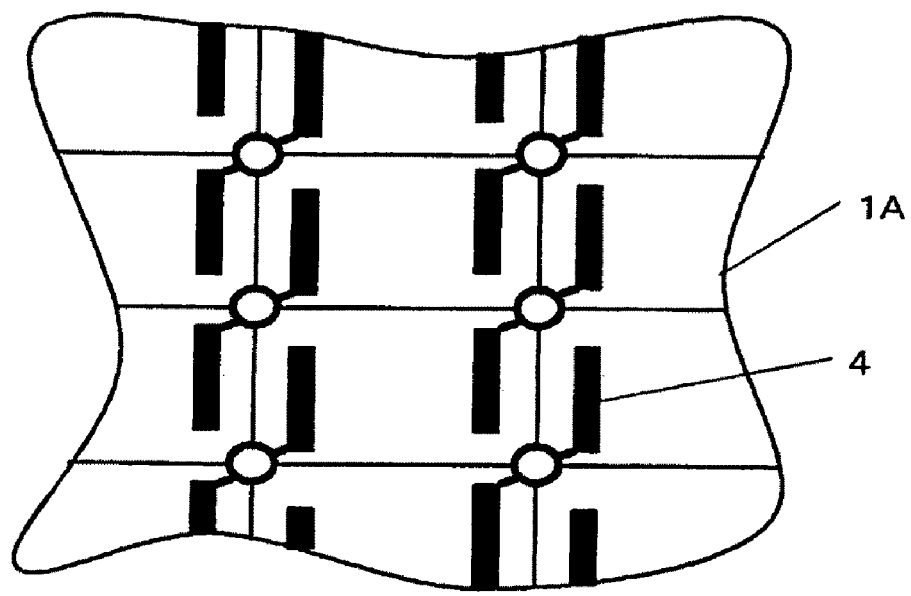
FIG. 7 is a diagram showing that the pattern of the crystal holding terminals is formed on the sheet-like ceramic plate.
Figure 8:
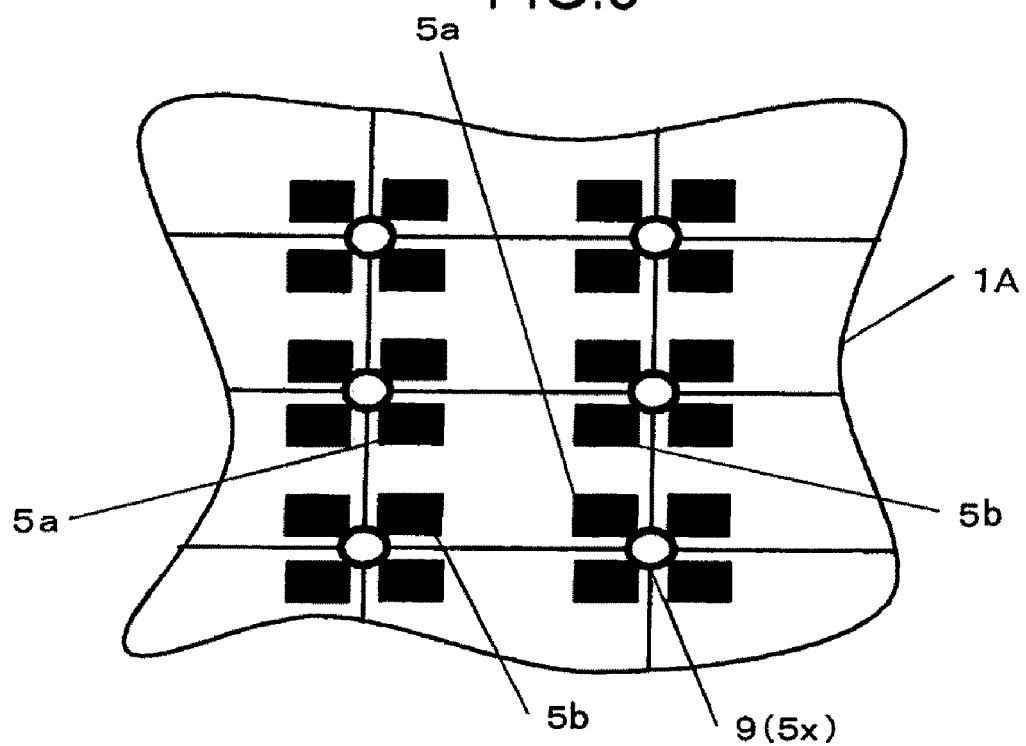
FIG. 8 is a diagram showing that the pattern of the mount terminals is formed on the sheet-like ceramic plate.
Figure 9:
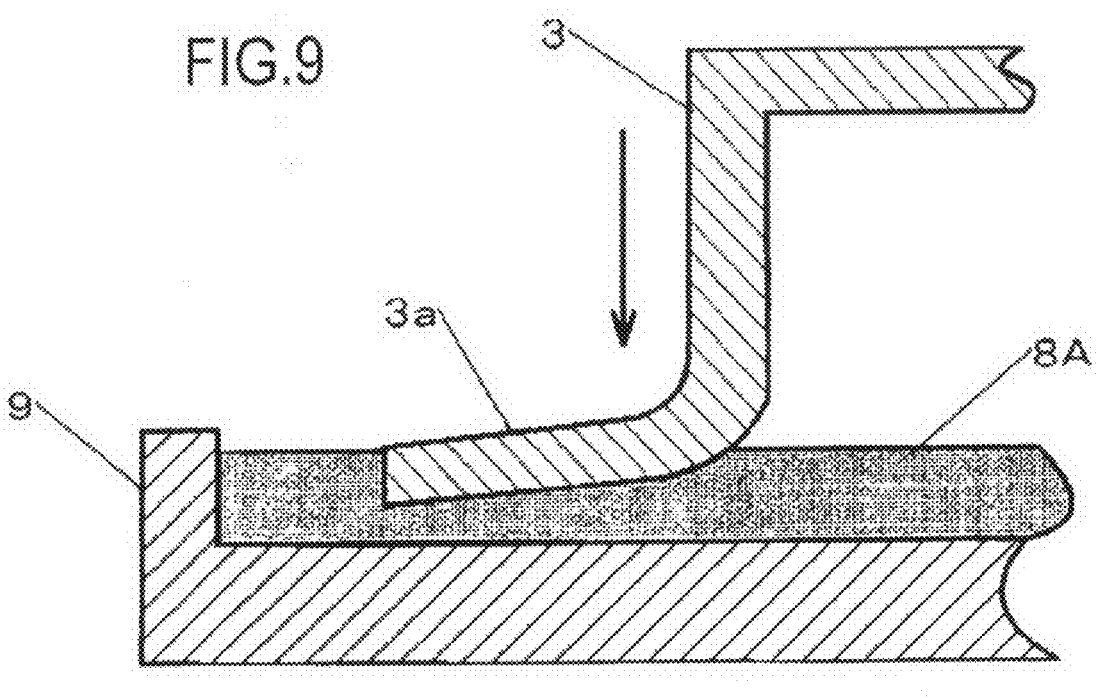
FIG. 9 is an explanatory sectional view showing a first resin applying step.
Figure 10:
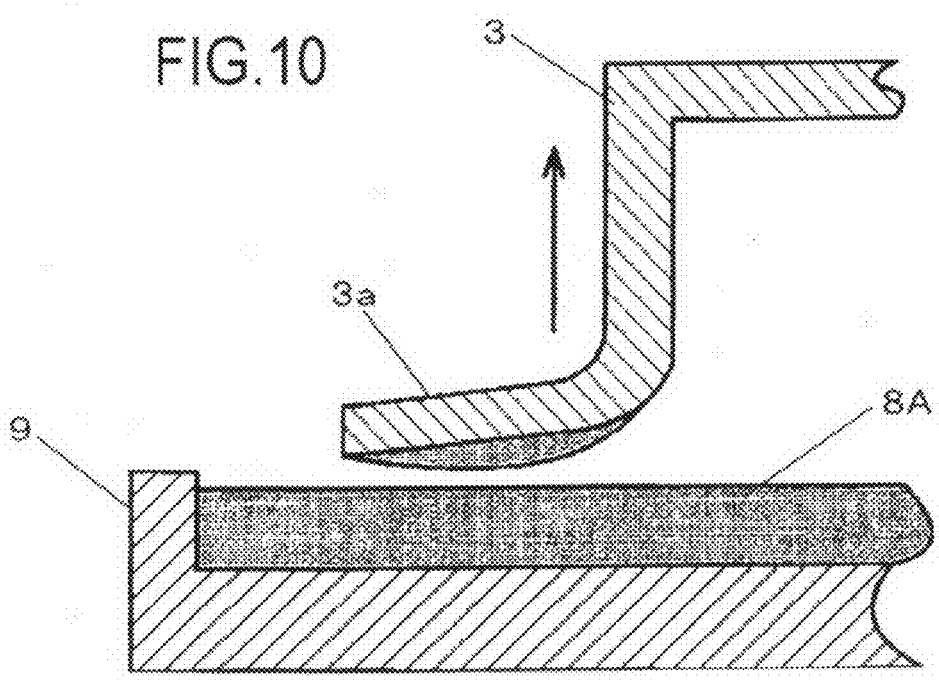
FIG. 10 is an explanatory sectional view showing a second resin applying step.

Next, a manufacturing method of the present oscillator will be described with reference to FIGS. 6 to 10. FIG. 6 is a diagram showing that through holes and break lines are formed in a sheet-like ceramic plate, FIG. 7 is a diagram showing that the pattern of the crystal holding terminals is formed on the sheet-like ceramic plate, FIG. 8 is a diagram showing that the pattern of the mount terminals is formed on the sheet-like ceramic plate, FIG. 9 is an explanatory sectional view showing a first resin applying step, and FIG. 10 is an explanatory sectional view showing a second resin applying step.

[First Step: FIG. 6/Sheet-Like Ceramic Material Firing]

First, a sheet-like ceramic material is formed as the material of a sheet-like ceramic base 1A.

In the sheet-like ceramic material, as shown in FIG. 6, break lines for separating adjoining regions corresponding to the individual ceramic bases 1 from one another are formed, and the through holes 9 are formed in four corner portions of each base.

Subsequently, the sheet-like ceramic material provided with the through holes 9 is fired, thereby obtaining the sheet-like ceramic base 1A.

[Second Step: FIGS. 7 and 8/Circuit Pattern Formation]

Next, the regions corresponding to circuit patterns of the sheet-like ceramic base 1A are provided with a metal paste of the AgPd alloy by printing using masks.

As to each circuit pattern, as shown in FIG. 7, the pattern of the crystal holding terminals 4 is formed on one main surface (the front surface), and as shown in FIG. 8, the pattern of the mount terminals 5a and 5b is formed on the other main surface (the back surface). Furthermore, the through terminals 5x are formed on the wall faces of the through holes 9.

The crystal holding terminals 4 on the one main surface (the front surface) are point-symmetric around the center of each ceramic base 1 as described above. That is, the leading terminals 4a are formed along the diagonal line of the ceramic base 1.

Moreover, one set of diagonally formed mount terminals 5a on the other main surface (the back surface) are external crystal terminals electrically connected to the crystal holding terminals 4 through the through terminals 5x and the leading terminals 4a, and the other set of diagonally formed mount terminals 5b are dummy terminals.

Subsequently, the metal paste of the AgPd alloy is fired to obtain the sheet-like ceramic base 1A provided with the circuit patterns.

It is to be noted that a ceramic firing temperature is from about 1500 to 1600° C. and the firing temperature of the AgPd alloy is a lower temperature of 850° C., whereby after firing the ceramic material, the AgPd alloy paste is applied, and fired together with the ceramic material.

This is because if the AgPd alloy paste is applied to the ceramic material and fired at the ceramic firing temperature, the AgPd alloy paste is agglomerated in the form of grains owing to the excessively high temperature and any circuit pattern cannot be formed.

[Third Step/Crystal Piece Mounting]

Next, the outer peripheral portion of the crystal piece 2 including the leading electrodes 6b extended from the excitation electrodes 6a is secured and mounted onto each crystal holding terminal 4 of the sheet-like ceramic base 1A provided with the circuit patterns by the conductive adhesive 7, to electrically and mechanically connect the crystal piece to the terminals.

Here, one set of diagonal portions of the crystal piece 2 including the extended leading electrodes 6b are secured.

[Fourth Step/Frequency Regulation]

Next, the vibration frequency of each crystal piece 2 as a crystal oscillator mounted (secured) onto the sheet-like ceramic base 1A is regulated in accordance with a mass load effect.

Specifically, on the back surface of the sheet-like ceramic base 1A, a measurement terminal (a probe) from a measurement unit is brought into contact with the mount terminal 5a electrically connected to each crystal piece 2. Subsequently, the excitation electrode 6a on the front surface of the crystal piece 2 on which a plate face is exposed is irradiated with gas ions to cut the front surface from the electrode, and the mass of the excitation electrode 6a is decreased to regulate the vibration frequency from a low frequency to a high frequency.

Alternatively, for example, a metal film is applied onto the excitation electrode 6a by evaporation or sputtering, whereby the vibration frequency may be regulated from a high frequency to a low frequency.

[Fifth Step/Metal Cover Joining (Sealing)]

Next, the opening end face of the metal cover 3 having the recessed shape is joined, via the seal material 8, to the front surface of the outer periphery of the rectangular region corresponding to each ceramic base 1 of the sheet-like ceramic base 1A on which the crystal piece 2 is mounted.

Hereinafter, a joining method of the metal cover 3 to the sheet-like ceramic base 1A according to the present embodiment will be described.

[Immersion: FIG. 9]

First, as shown in FIG. 9, the opening end face of the metal cover 3 is immersed into a molten resin solution 8A in an arrow direction (a downward direction). Here, the opening end face of the metal cover 3 is immersed so as to uniformly come in contact with the surface of the molten resin solution 8A.

As described above, the opening comprises the flange 3a having the gradient (the inclined face) descending toward the outer dead end, and the flange 3a is immersed up to the vicinity of the upper end of the outer peripheral end face (thickness) thereof. That is, the flange 3a is immersed to such an extent that the lower surface of the start end portion (the root portion) of the inclined face thereof comes in contact with the surface of the molten resin solution 8A.

Therefore, the shape of the flange 3a is inclined to such an extent that the lower surface of the root portion of the flange comes in contact with the molten resin solution 8A and the outer peripheral end face of the flange is immersed into the molten resin solution 8A up to the vicinity of the upper surface of the flange.

[Draw Up: FIG. 10]

Next, as shown in FIG. 10, the metal cover 3 is drawn up from the molten resin solution 8A in an arrow direction (an upward direction) in a state in which the molten resin 8 is deposited on the opening end face of the metal cover 3. In this case, a reservoir portion is formed so as to bulge to the downside along the inclined face of the flange 3a of the metal cover 3. Therefore, the molten resin 8 is concentrated on the reservoir portion along the inclined face, and the molten resin 8 is raised around the center of gravity of the inclined face owing to surface tension.

Subsequently, in a state in which the molten resin 8 is deposited on the opening end face of the metal cover 3 (the inclined face of the flange 3a), the metal cover 3 is moved to position the opening end face thereof along the outer periphery of the front surface of the ceramic base 1. The opening end face is bonded to the outer periphery of the front surface of the ceramic base 1 owing to the weight of the metal cover 3 itself or by lightly pressing the cover.

Finally, the surface mount crystal oscillator is entirely heated to cure the molten resin 8, thereby joining the metal cover 3 to the ceramic base 1 which is sealed.

[Sixth Step/Dividing]

Finally, the sheet-like ceramic base 1A including the crystal oscillators collected therein is longitudinally and transversely divided along the break lines to obtain individual surface mount crystal oscillators.

In the manufacturing method of the present embodiment, the circuit pattern (the crystal holding terminals 4, the through terminals 5x and the mount terminals 5a) of the ceramic base 1 is made of the AgPd alloy. After firing the sheet-like ceramic material provided with the through holes 9, the AgPd alloy paste is applied and fired to form the circuit pattern.

Therefore, as compared with a conventional example in which a tungsten (W) paste is applied to the sheet-like ceramic material and fired to form nickel (Ni) and gold (Au) by electrolytic plating, two electrolytic plating steps are not necessary, whereby the number of manufacturing steps can be decreased.

Moreover, since the electrolytic plating steps are not necessary, for example, electrolytic plating wiring lines for electrically connecting the circuit patterns of the ceramic bases 1 to each other are also not necessary, which produces an effect that the circuit patterns can be simplified and made inexpensive.

Moreover, here, in the state of the sheet-like ceramic base 1A provided with the circuit patterns, the crystal pieces 2 are mounted (the third step), the frequency is regulated (the fourth step) and the metal covers 3 are joined (the fifth step).

Therefore, in the state of the sheet-like ceramic base 1A, these steps can continuously be performed, which produces an effect that productivity can be improved.

Furthermore, in the present embodiment, the mount terminals 5a and 5b on the back surface of the ceramic base 1 are four electrically independent terminals. On the other hand, in the state of the sheet-like ceramic base 1A, the mount terminals 5a and 5b (four terminals) in four corner portions of adjoining rectangular regions are electrically connected in common through the through terminals 5x.

Therefore, also in a state where the mount terminals 5a and 5b in the four corner portions are connected in common, an effect is produced that the measurement terminal can be brought into contact with one set of mount terminals 5a of the diagonal portions connected to the crystal holding terminals 4 of each ceramic base 1 to regulate the vibration frequency of each crystal piece 2.

Moreover, according to the above manufacturing method, the opening end face of the cover 3 including the flange 3a is immersed into the molten resin solution 8A to directly deposit the molten resin 8 on the opening end face. For example, unlike a case where a shaped resin is tentatively secured, the number of steps can be decreased to lower a manufacturing unit price.

Furthermore, since the reservoir portion of the molten resin 8 is formed on the inclined face of the flange 3a of the metal cover 3, an appropriate amount of molten 5. resin 8 can uniformly be deposited, and shortage of the molten resin 8 does not occur, but the joining can sufficiently be performed to acquire air tightness. Furthermore, a surplus of the molten resin 8 does not flow into the oscillator and is not deposited on the crystal piece 2, and vibration characteristics can satisfactorily be kept.

Figure 11:
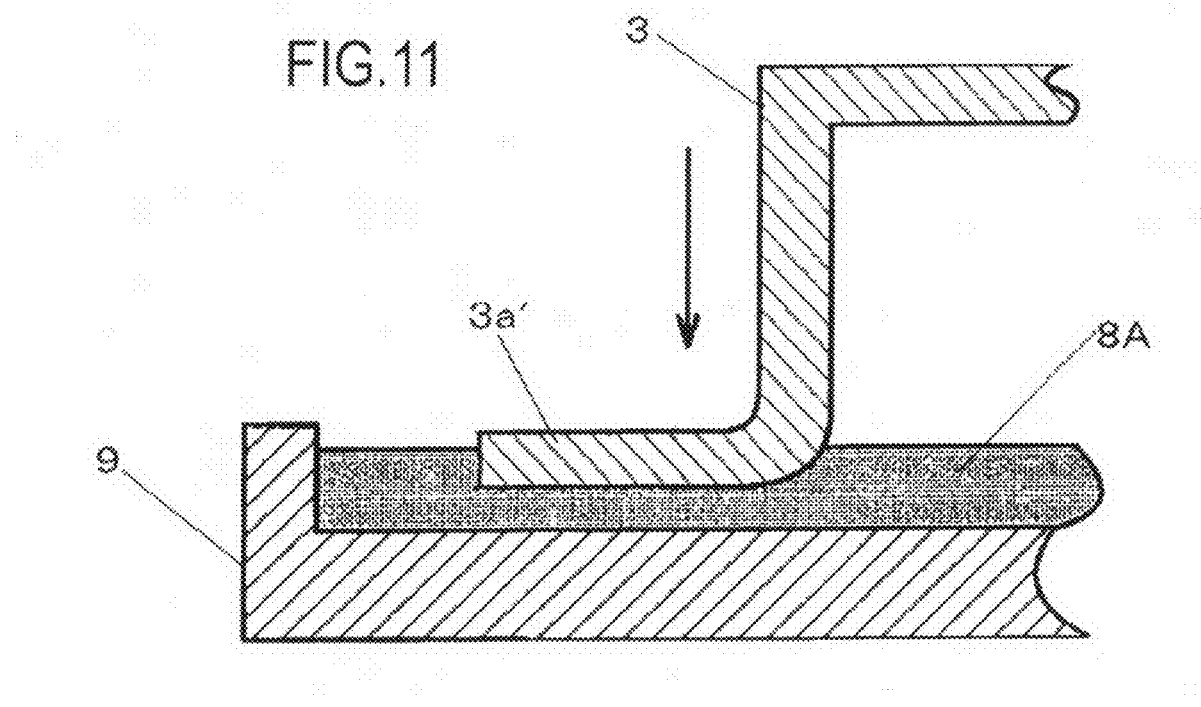
FIG. 11 is an explanatory sectional view showing that a flange which does not have an inclined face is immersed into a molten resin.
Figure 12:
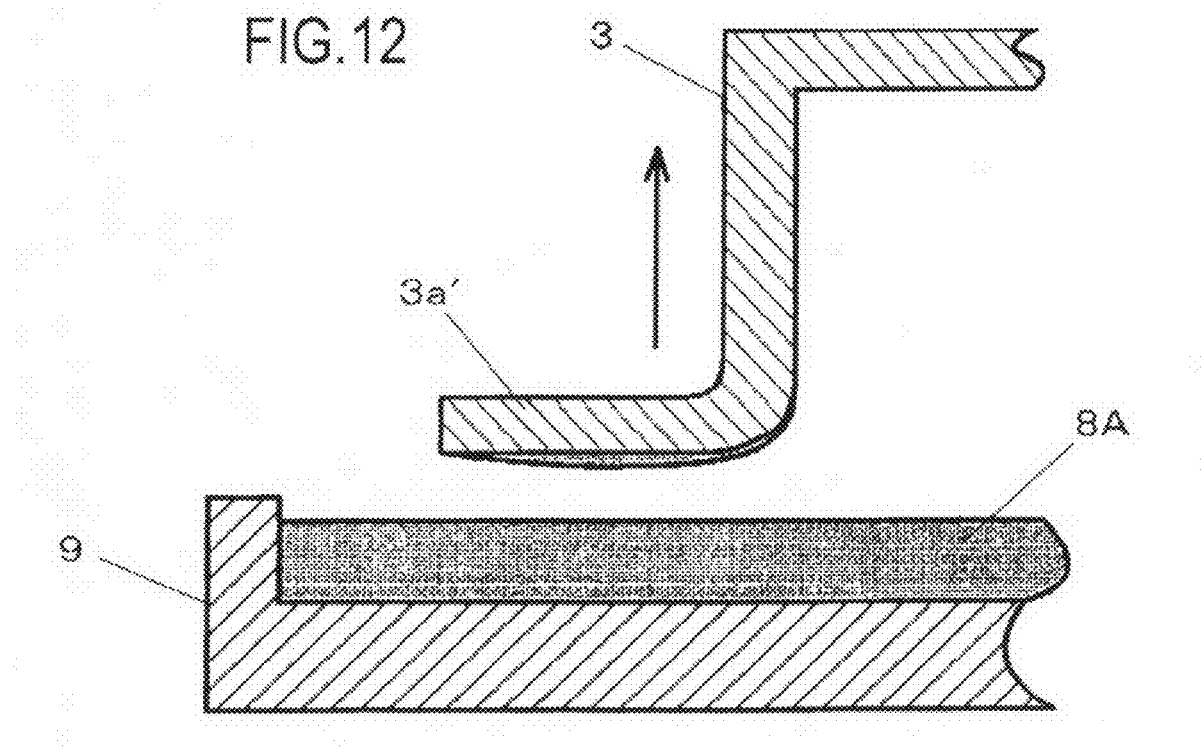
FIG. 12 is an explanatory sectional view showing that the flange which does not have the inclined face is drawn up from the molten resin.

[Comparison: FIGS. 11 and 12]

For comparison with FIGS. 9 and 10, there will be described a case where a flange portion does not have any inclined face. FIG. 11 is an explanatory sectional view showing that a flange which does not have the inclined face is immersed into a molten resin, and FIG. 12 is an explanatory sectional view showing that the flange which does not have the inclined face is drawn up from the molten resin.

As shown in FIGS. 11 and 12, in case of a flange 3a' which is flat in a horizontal direction, a reservoir portion of a molten resin 8 deposited on the lower surface of the flange 3a' is substantially uniformly formed, whereby it is seen that a slightly less amount of the resin is applied and the amount is not sufficient.

Figure 13:
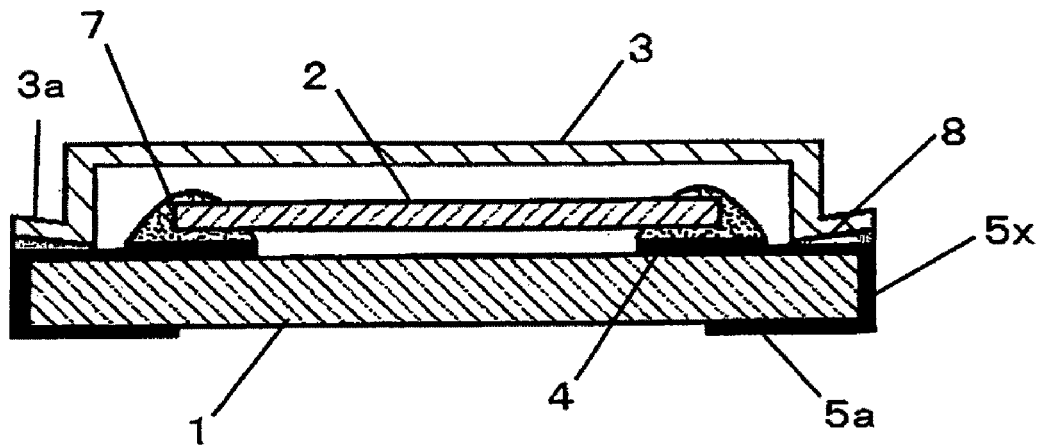
FIG. 13 is an explanatory sectional view showing a configuration of another flange.

[Another Flange Configuration: FIG. 13]

Next, the flange 3a of the metal cover 3 will be described. In FIGS. 1, 9 and 10, the flange has the gradient descending toward the outer dead end. Conversely, when the flange has an ascending gradient, a similar effect is obtained. For example, as shown in FIG. 13, the outer dead end of the flange 3a has such a shape as to tip up.

FIG. 13 is an explanatory sectional view showing another flange configuration.

Figure 14:
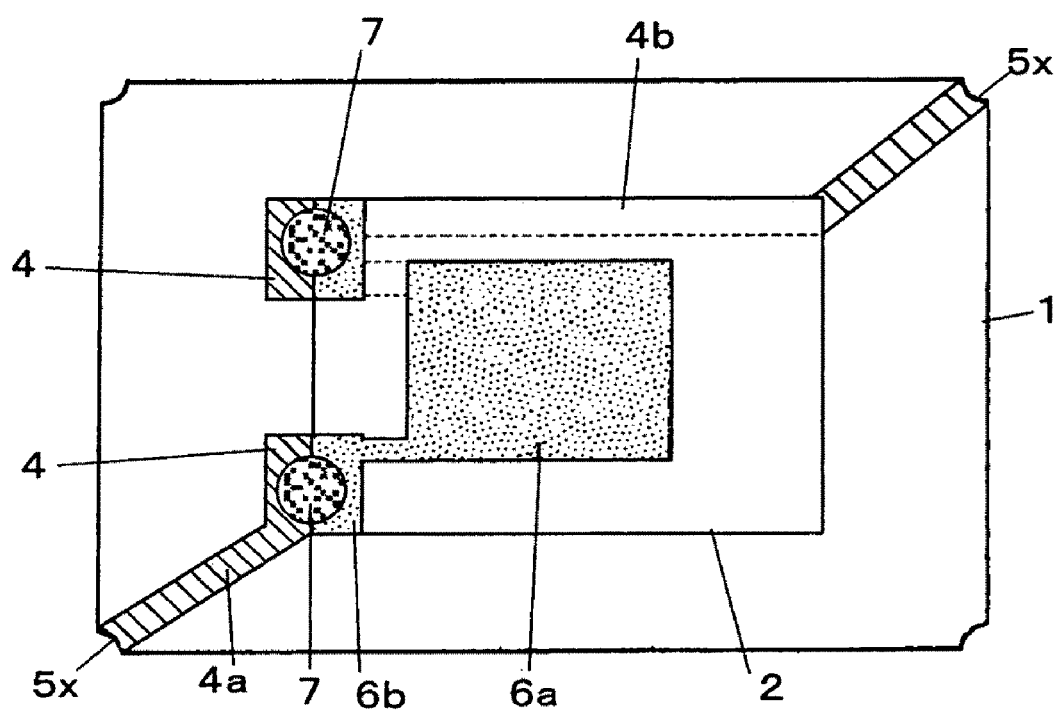
FIG. 14 is an explanatory plan view of a surface mount crystal oscillator according to another embodiment.

[Cantilever Type: FIG. 14]

Next, a surface mount crystal oscillator according to another embodiment will be described with reference to FIG. 14. FIG. 14 is an explanatory plan view of the surface mount crystal oscillator according to the other embodiment.

In the surface mount crystal oscillator according to the other embodiment (the other oscillator), as shown in FIG. 14, a leading electrode 6b is formed in one end portion of a crystal piece 2, and the one end portion is connected to a crystal holding terminal 4 via a conductive adhesive 7. In the one crystal holding terminal 4, a leading terminal 4a is formed in the shortest corner portion, and in another crystal holding terminal 4, a leading terminal 4b is led under the crystal piece 2 in a horizontal direction of FIG. 14, and formed to be connected to the shortest corner portion from the corner portion of the crystal piece 2.

A constitution of FIG. 14 is referred to as a 'cantilever' type, because one side of the crystal piece 2 is held.

Also in the cantilever type of FIG. 14, the crystal piece is connected to mount terminals 5a on the back surface via through terminals 5x formed in through holes 9 along a diagonal line in the same manner as in the both-ends holding type of the present oscillator, and the back surface has a pattern of mount terminals 5a and 5b shown in FIG. 8.

It is to be noted that a manufacturing method of the other oscillator in FIG. 14 is similar to the manufacturing method of the present oscillator, which produces an effect that productivity can be improved.

Moreover, a measurement terminal is brought into contact with the mount terminal 5a on the back surface, whereby frequency regulation of each crystal piece 2 can similarly be performed.

Furthermore, also in the above cantilever type, the metal cover 3 comprising the flange 3a having a special shape as shown in FIGS. 1, 9 and 10 and FIG. 13 is joined to seal the oscillator according to the above manufacturing method, which produces an effect that an adequate amount of the molten resin 8 can be used and an inexpensive and satisfactory product can be obtained.

[Effect of the Embodiment]

According to the present oscillator and the other oscillator, the ceramic base 1 is a single plate, and hence a manufacturing unit price can basically be lowered. The electrodes including the crystal holding terminals 4 are made of the AgPd alloy. Therefore, as compared with a conventional case where W, Ni and Au are used, an effect is produced that a material cost of the electrodes or the number of steps can be decreased to further make the oscillator inexpensive.

Furthermore, according to the present oscillator and the other oscillator, the leading terminals 4a from the crystal holding terminals 4 are led to the corner portions of the ceramic base 1 along the diagonal line thereof, and connected to the mount terminals 5a on the back surface via the through terminals 5x formed on the wall faces of the through holes 9 formed in the corner portions. Therefore, as compared with a case where the leading terminals 4a are led in the horizontal direction or the vertical direction, the leading terminals can be lengthened. Even if the opening end face portion of the metal cover 3 comes in contact with one end of the one crystal holding terminal 4, the cover portion is distant from the through terminal 5x, which produces an effect that the cover can be prevented from being brought into contact with the through terminal 5x to avoid electric short (the short circuit).

Moreover, in the present oscillator, the end portion of the crystal holding terminal 4 is shorter than the leading electrode 6b of the crystal piece. Therefore, if the opening end face portion as one side of the metal cover 3 comes in contact with the one crystal holding terminal 4, the cover can be prevented from coming in contact with the other crystal holding terminal 4 in the same direction.

In consequence, an effect is produced that a pair of crystal holding terminals 4 can be prevented from electrically causing the short circuit via the metal cover 3, and productivity can be improved.

Furthermore, in the other oscillator, the leading terminal 4b is passed under the crystal piece 2 and connected to the leading electrode 6b, which produces an effect that a pair of crystal holding terminals 4 can be prevented from causing the short circuit via the metal cover 3 with respect to the vertical direction of FIG. 14.

However, the crystal holding terminals 4 are arranged side by side in the vertical direction of FIG. 14, and hence attention needs to be paid to displacement in a transverse direction of FIG. 14.

Moreover, according to the present oscillator and the other oscillator, resistance to the displacement of the metal cover 3 is imparted, which produces an effect that the variance of the secured state of the conductive adhesive 7 is suppressed and stabilized, and aging characteristics of the surface mount crystal oscillator can satisfactorily be kept.

Furthermore, the opening end face of the metal cover 3 including the flange 3a having the special shape is immersed into the molten resin solution 8A to directly deposit the molten resin 8 on the opening end face, the reservoir portion of the molten resin 8 is formed on the inclined face of the flange 3a, and the flange is secured and joined onto the substrate 1 to seal the oscillator, whereby the number of steps can be decreased to lower a manufacturing unit price. The appropriate amount of the molten resin 8 is uniformly deposited, whereby shortage of the molten resin 8 does not occur and the joining can sufficiently be performed to acquire air tightness. A further effect is produced that the surplus of the molten resin 8 does not flow into the oscillator, and is not deposited on the crystal piece 2, and vibration characteristics can satisfactorily be kept.

The present invention is suitable for a surface mount crystal oscillator which can enhance a product quality and improve productivity while realizing miniaturization and a manufacturing method of the, oscillator.

What is claimed is:

1. A surface mount crystal oscillator comprising a crystal piece held by first and second crystal holding terminals on a rectangular ceramic substrate, and sealed with a metal cover via a seal material of a molten resin, wherein one leading electrode and the other leading electrode of the crystal piece are led in opposite directions, the first crystal holding terminal and the second crystal holding terminal constitute such a both-ends holding type as to hold both ends of the crystal piece, on wall faces of through holes formed in corner portions of the substrate, through terminals are formed, on the front surface of the substrate, a first leading terminal led from the first crystal holding terminal is connected to the through terminal of the shortest corner portion, and a second leading terminal led from the second crystal holding terminal is connected to the through terminal of the corner portion in a direction reverse to a direction in which the first leading terminal is led, on the back surface of the substrate, mount terminals connected to the through terminals are formed, the first crystal holding terminal is connected to the one leading electrode of the crystal piece by a conductive adhesive in an end portion from which the first leading terminal is led, the second crystal holding terminal is connected to the other leading electrode of the crystal piece by the conductive adhesive in an end portion from which the second leading terminal is led, and the opening end face of the metal cover joined onto the ceramic substrate via the molten resin comprises a flange having an inclined face.

2. The surface mount crystal oscillator according to claim 1, wherein the end portion of the first crystal holding terminal on a side on which any conductive adhesive is not disposed is formed to be short inwardly from the end portion of the one leading electrode, and the end portion of the second crystal holding terminal on a side on which any conductive adhesive is not disposed is formed to be short inwardly from the end portion of the other leading electrode.

3. The surface mount crystal oscillator according to claim 2, wherein the flange of the opening end face of the metal cover has the inclined face descending from the inside to the outside or the inclined face ascending from the inside to the outside.

4. The surface mount crystal oscillator according to claim 1, wherein the flange of the opening end face of the metal cover has the inclined face descending from the inside to the outside or the inclined face ascending from the inside to the outside.

5. A surface mount crystal oscillator comprising a crystal piece held by first and second crystal holding terminals on a rectangular ceramic substrate, and sealed with a metal cover via a seal material of a molten resin, wherein one leading electrode and the other leading electrode of the crystal piece are led in the same direction, the first crystal holding terminal and the second crystal holding terminal constitute such a cantilever type as to hold one end of the crystal piece, on wall faces of through holes formed in corner portions of the substrate, through terminals are formed, on the front surface of the substrate, a first leading terminal led from the first crystal holding terminal is connected to the through terminal of the shortest corner portion, and a second leading terminal led from the second crystal holding terminal is connected to the through terminal of the corner portion in a direction reverse to a direction in which the first leading terminal is led, on the back surface of the substrate, mount terminals connected to the through terminals are formed, the first crystal holding terminal is connected to the one leading electrode led to one side of the crystal piece by a conductive adhesive in an end portion from which the first leading terminal is led, the second crystal holding terminal is connected to the other leading electrode led to the one side of the crystal piece by a conductive adhesive in the one side of the crystal piece from which the other leading electrode is led, and the second leading terminal passes under the crystal piece from a position of the second crystal holding terminal connected by the conductive adhesive and is connected to the through terminal of the corner portion in the direction reverse to the direction in which the first leading terminal is led, and the opening end face of the metal cover joined onto the ceramic substrate via the molten resin comprises a flange having an inclined face.

6. The surface mount crystal oscillator according to claim 5, wherein the flange of the opening end face of the metal cover has the inclined face descending from the inside to the outside or the inclined face ascending from the inside to the outside.

7. A manufacturing method of a surface mount crystal oscillator comprising a crystal piece held by first and second crystal holding terminals on a rectangular ceramic substrate, and sealed with a metal cover via a seal material of a molten resin, comprising:

a step of forming, in a sheet-like ceramic material, break lines which specify individual ceramic substrate regions and through holes which correspond to corner portions of the regions and firing the ceramic material to form a sheet-like ceramic base;

a step of forming metal layers of through terminals on wall faces of the through holes, forming, on the front surface of the ceramic base, a pattern of a metal layer in which the first crystal holding terminal and a first leading terminal led from the terminal are connected to the through terminal of the shortest corner portion, and a second leading terminal led from the second crystal holding terminal is connected to the through terminal of the corner portion in a direction reverse to a direction in which the first leading terminal is led, and forming, on the back surface of the ceramic base, a pattern of a metal layer of mount terminals connected to the through terminals;

a step of mounting the crystal piece on the first and second crystal holding terminals;

a step of regulating a vibration frequency by use of the mount terminal connected to the first crystal holding terminal and the mount terminal connected to the second crystal holding terminal; and a step of immersing, into a molten resin solution, a flange having an inclined face as the opening end face of the metal cover joined onto the ceramic substrate via the molten resin to form a reservoir portion of the molten resin on the lower surface of the flange, and securing the flange onto the ceramic substrate in a state in which the reservoir portion is formed.

8. The manufacturing method of the surface mount crystal oscillator according to claim 7, wherein an excitation electrode on the front surface of the crystal piece is irradiated with gas ions to cut the front surface from the excitation electrode, and a mass of the excitation electrode is decreased to regulate the vibration frequency from a low frequency to a high frequency.

9. The manufacturing method of the surface mount crystal oscillator according to claim 7, wherein a metal film is applied onto the excitation electrode to regulate the vibration frequency from a high frequency to a low frequency.

* * * * *